United States Patent
Kang

(10) Patent No.: US 7,372,311 B2
(45) Date of Patent: May 13, 2008

(54) DELAY LOCKED LOOP FOR CONTROLLING DUTY RATE OF CLOCK

(75) Inventor: Yong-Gu Kang, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 55 days.

(21) Appl. No.: 11/319,720

(22) Filed: Dec. 29, 2005

(65) Prior Publication Data

US 2006/0197565 A1 Sep. 7, 2006

(30) Foreign Application Priority Data

Mar. 2, 2005 (KR) ...................... 10-2005-0017303

(51) Int. Cl.
*H03L 7/06* (2006.01)

(52) U.S. Cl. ...................... 327/158; 327/156; 327/175

(58) Field of Classification Search ........ 327/146–147, 327/149, 155–156, 158, 175
See application file for complete search history.

(56) References Cited

U.S. PATENT DOCUMENTS

| | | | | |
|---|---|---|---|---|
| 5,614,855 | A * | 3/1997 | Lee et al. .................... | 327/158 |
| 6,100,733 | A * | 8/2000 | Dortu et al. ................. | 327/149 |
| 6,373,309 | B1 | 4/2002 | Bang | |
| 6,539,072 | B1 | 3/2003 | Donnelly et al. | |
| 6,677,792 | B2 | 1/2004 | Kwak | |
| 6,703,879 | B2 * | 3/2004 | Okuda et al. ................ | 327/158 |
| 6,768,361 | B2 | 7/2004 | Kwak | |
| 6,853,225 | B2 | 2/2005 | Lee | |
| 6,859,081 | B2 | 2/2005 | Hong et al. | |
| 6,895,522 | B2 | 5/2005 | Johnson et al. | |
| 7,161,397 | B2 * | 1/2007 | Lee et al. .................... | 327/149 |
| 7,279,946 | B2 * | 10/2007 | Minzoni ..................... | 327/158 |
| 2003/0219088 | A1 * | 11/2003 | Kwak .......................... | 375/376 |
| 2007/0046346 | A1 * | 3/2007 | Minzoni ..................... | 327/158 |
| 2007/0069782 | A1 * | 3/2007 | Shin ........................... | 327/158 |

FOREIGN PATENT DOCUMENTS

| | | |
|---|---|---|
| JP | 11-110065 | 4/1999 |
| JP | 2003-347908 A | 12/2003 |
| JP | 2004-064735 A | 2/2004 |
| JP | 2004-129255 A | 4/2004 |
| KR | 2003-0052361 | 6/2003 |
| KR | 2003-0052650 | 6/2003 |
| KR | 10-2004-0020990 | 3/2004 |
| KR | 2004-0037786 | 5/2004 |

\* cited by examiner

*Primary Examiner*—N. Drew Richards
*Assistant Examiner*—Patrick O'Neill
(74) *Attorney, Agent, or Firm*—McDermott Will & Emery LLP

(57) ABSTRACT

There is provided a DLL capable of controlling a duty rate of a clock by a fuse option or an EMRS input. The DLL includes a first clock buffer, a second clock buffer, a first delay line, a second delay line, a shift register, a first duty control unit, a second duty control unit, a first DLL driver, a second DLL driver, a delay model, a phase comparator, and a shift control unit. In the DLL, a first duty control unit and a second duty control unit control each duty rate of the output clocks of a first and a second delay lines respectively through the EMRS input or the fuse option. Therefore, it is possible to control the duty rate of DLL clocks through the EMRS input or the fuse option.

16 Claims, 6 Drawing Sheets

US 7,372,311 B2

DELAY LOCKED LOOP FOR CONTROLLING DUTY RATE OF CLOCK

FIELD OF THE INVENTION

The present invention relates to a design technology for a semiconductor device; and more particularly, to a delay locked loop (DLL) for controlling a duty rate of a clock.

DESCRIPTION OF RELATED ART

Typically, a clock is used as a reference for adjusting an operational timing in a system or circuit of a semiconductor memory device. In particular, the clock is also used for securing high-speed and error-free operation in the system or the circuit. When an external clock is used for an internal circuit, there is inevitably generated a delay time between the external clock and an internal clock. This is so called a clock skew. Therefore, in order to compensate the delay time and to equalize a phase of the internal clock with that of the external clock, a delay locked loop (hereinafter, referred to as a DLL) is typically used in the semiconductor memory device.

In addition, the DLL are broadly used in a synchronous semiconductor memory device including a double data rate synchronous dynamic random access memory (DDR SDRAM) because it has an advantage with being less affected by a noise, as compared to a phase locked loop (hereinafter, referred to as PLL). Among various types of the DLL, a register-controlled DLL is the most generally used.

FIG. 1 is a block diagram setting forth a conventional register-controlled DLL of a DDR SDRAM.

Referring to FIG. 1, the conventional register-controlled DLL includes a first clock buffer 11, a second clock buffer 12, a first delay line 13, a second delay line 14, a shift register 15, a first DLL driver 20, a second DLL driver 21, a delay model 17, a phase comparator 18, and a shift controller 16.

Herein, the first clock buffer 11 receives an external clock bar signal CLKB and generates an internal falling clock FCLK in synchronization with a falling edge of an external clock signal CLK. The second clock buffer 12 receives the external clock signal CLK and generates an internal rising clock signal RCLK in synchronization with a rising edge of the external clock signal CLK.

The first delay line 13 receives the internal falling clock FCLK in synchronization with the falling edge of the external clock CLK, and the second delay line 14 receives the internal rising clock RCLK in synchronization with the rising edge of the external clock CLK. Meanwhile, the shift register 15 determines a delay amount of the first and the second delay lines 13 and 14.

The first DLL driver 20 drives an output iFCLK of the first delay line 13 so as to generate a first DLL clock FCLK_DLL, and the second DLL driver 21 drives an output iRCLK of the second delay line 14 so as to generate a second DLL clock RCLK_DLL.

The delay model 17 is configured such that it receives the output iRCLK of the second delay line 14 and its clock has the same delay condition with an actual clock. The phase comparator 18 compares a feedback clock FBCLK outputted from the delay model 17 with the internal rising clock RCLK. The shift controller 16 outputs shift control signals SR and SL for controlling a shift direction of the shift register 15 in response to a control signal CTRL outputted from the phase comparator 18.

To begin with, the first clock buffer 11 receives a rising edge of the external clock bar signal CLKB so as to generate the internal falling clock FCLK in synchronization with the falling edge of the external clock CLK. Likewise, the second clock buffer receives the rising edge of the external clock CLK to thereby generate the internal rising clock RCLK.

At an initial operational mode, the internal rising clock RCLK is outputted through only a unit delay of the second delay line 14 in a delay monitor 10, and this clock is outputted as the feedback clock FBCLK which is delayed while passing through the delay model 17. Herein, the feedback clock FBCLK is delayed by a delay time of the delay model 17 in comparison with the output clock iRCLK of the second delay line 14.

Meanwhile, the phase comparator 18 compares the rising edge of the feedback clock FBCLK with the rising edge of the internal rising edge clock RCLK so as to generate the control signal CTRL. The shift controller 16 outputs the shift control signals SR and SL for controlling the shift direction of the shift register 15 in response to the control signal CTRL. The shift register 15 determines the delay amount of the first and the second delay lines 13 and 14 in response to the shift control signals SR and SL. At this time, if the shift right control signal SR is inputted, the register is shifted to a right direction. Vice versa, in case that the shift left control signal SL is inputted, the register is shifted to a left direction. Afterwards, comparing the feedback clock FBCLK of which the delay amount has been controlled, with the internal rising clock RCLK, the delay is locked at a moment that the feedback clock FBCLK and the internal rising clock RCLK have a minimum jitter. At this time, the first and the second DLL clocks RCLK_DLL and FCLK_DLL are outputted from the first and the second drivers 20 and 21, respectively, and they have the same phase with the external clock CLK.

Meanwhile, it is difficult for the first and the second DLL clocks RCLK_DLL and FCLK_DLL generated through the aforementioned process, to have a duty rate of about 50% due to various factors such as a manufacturing process, a driving voltage level, a temperature variance, and so forth.

Also, in order to adjust the duty rate after the fabrication of a chip, there has been only a method for re-modifying a mask in the prior art so that high expense and much time are needed after all.

SUMMARY OF THE INVENTION

It is, therefore, an object of the present invention to provide a delay locked loop (DLL) capable of controlling a duty rate of a clock by a fuse option or an extended mode register set (EMRS) input, without any modification of a mask.

In accordance with an aspect of the present invention, there is provided a DLL including: a clock delay unit for receiving an external clock and an external clock bar signal to generate an internal falling clock and an internal rising clock having a predetermined delay amount; a duty control unit for controlling each duty rate of the internal falling clock and the internal rising clock based on an extended mode register set (EMRS) input or a fuse option; and a DLL clock driving unit for driving output clocks of the duty control unit to generate a DLL clock.

In accordance with second aspect of the present invention, there is provided A semiconductor memory device for receiving an external clock to generate DLL clocks by controlling a duty rate including: a clock buffer for receiving an external clock to generate an internal rising clock in synchronization with a rising edge of the external clock; a delay line for receiving the internal rising clock in synchronization with the rising edge of the external clock; a shift register for determining a delay amount of the delay line; a duty control unit for controlling a duty rate of an output clock of the delay line based on the EMRS input or the fuse option to output a first and a second output clocks; a first DLL clock driving unit for driving the first output clock to generate a first DLL clock; a second DLL clock driving unit for driving the second output clock to generate a second DLL clock; a delay model configured such that it receives the first output and its clock has the same delay condition with an actual clock path; a phase comparator for comparing an output phase of the delay mode with a phase of the internal rising clock; and a shift control unit for controlling a shift direction of the shift register in response to a control signal outputted from the phase comparator.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
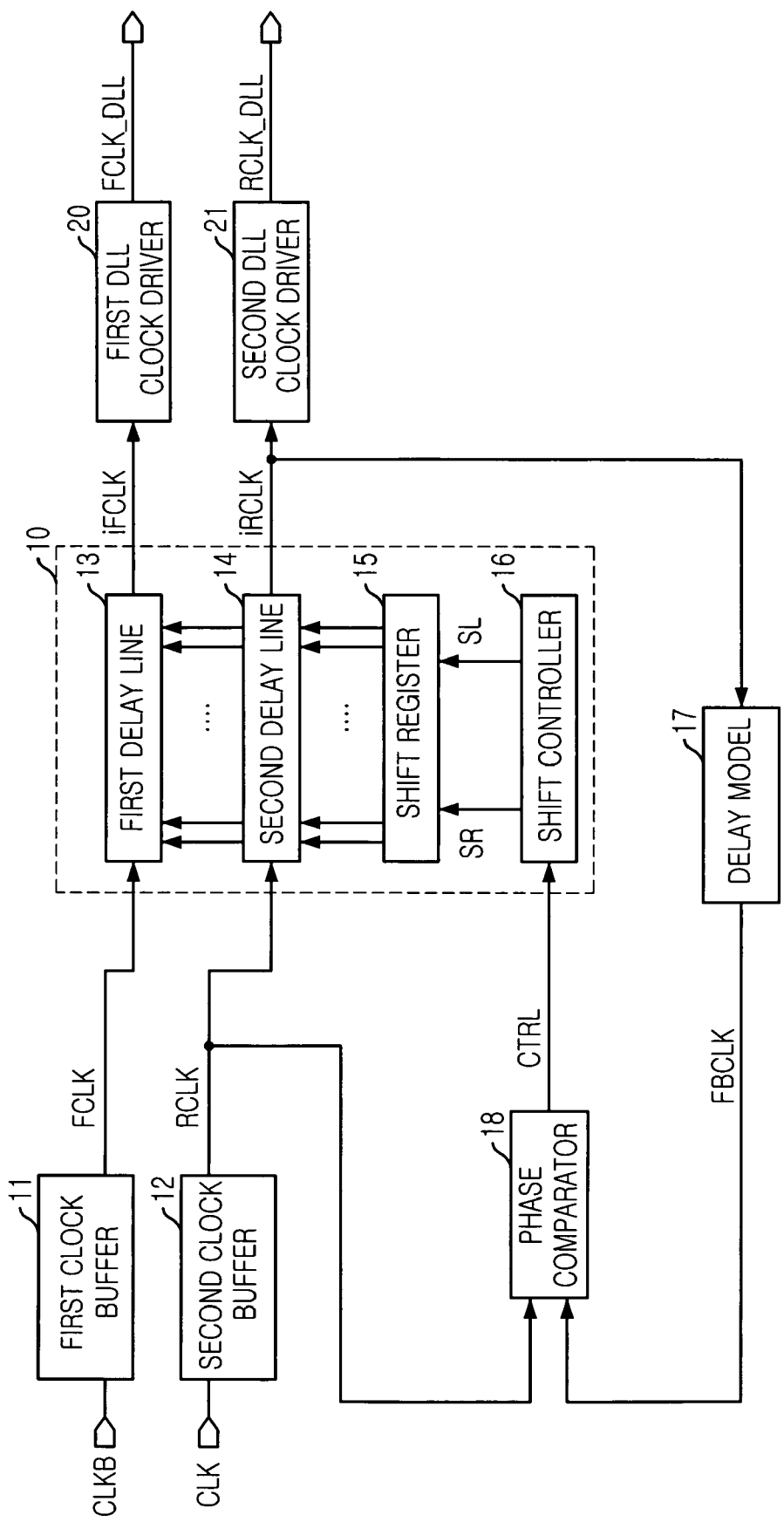
FIG. 1 is a block diagram setting forth a conventional register-controlled delay locked loop (DLL) of a DDR SDRAM.
Figure 2:
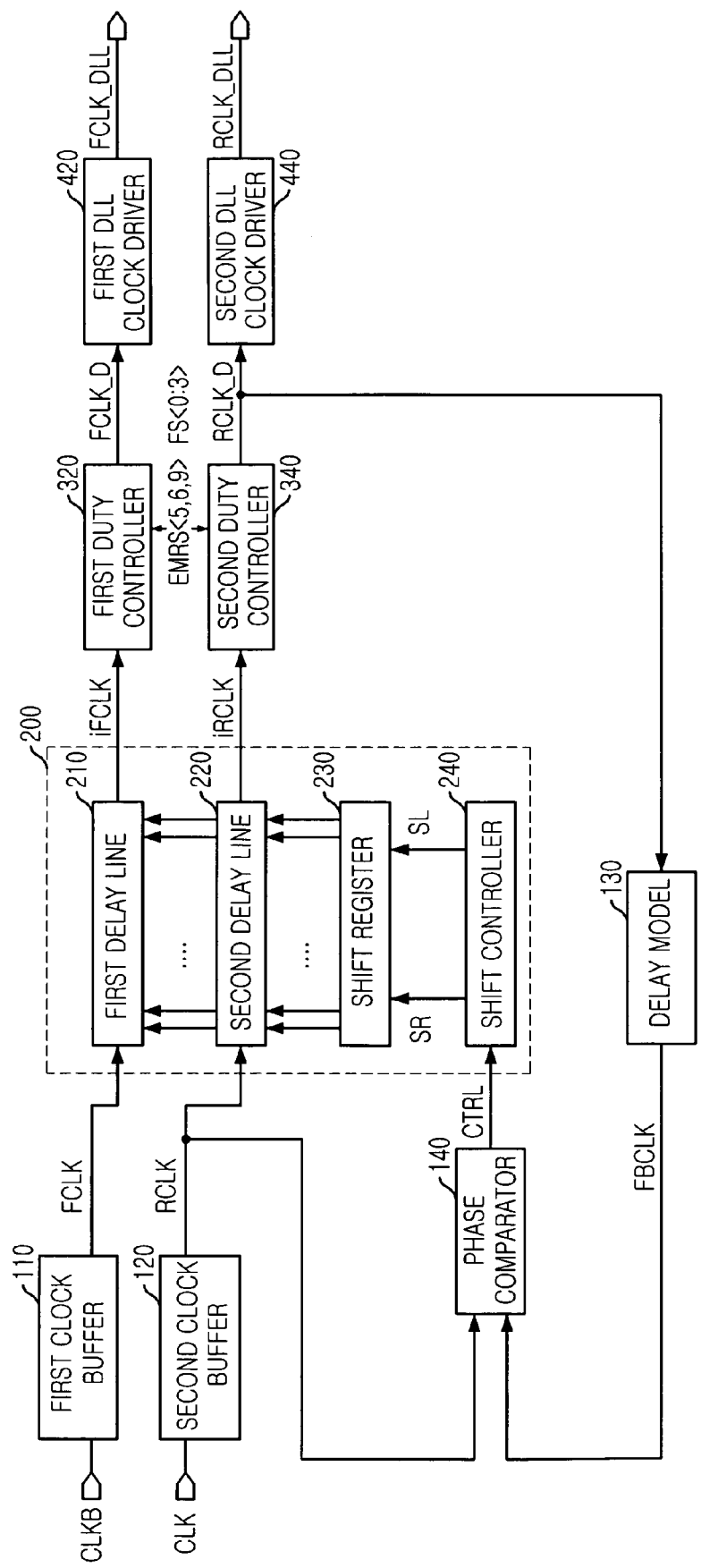
FIG. 2 is a block diagram setting forth a register-controlled DLL in accordance with a first embodiment of the present invention.

FIG. 2 is a block diagram setting forth a register-controlled DLL in accordance with a first embodiment of the present invention.

Referring to FIG. 2, the DLL of the present invention includes a first clock buffer 110, a second clock buffer 120, a first delay line 210, a second delay line 220, a shift register 230, a first duty controller 320, a second duty controller 340, a first DLL driver 420, a second DLL driver 440, a delay model 130, a phase comparator 140, and a shift controller 240.

Herein, the first clock buffer 110 receives an external clock bar signal CLKB and generates an internal falling clock FCLK in synchronization with a falling edge of an external clock signal CLK. The second clock buffer 120 receives the external clock signal CLK and generates an internal rising clock signal RCLK in synchronization with a rising edge of the external clock signal CLK.

The first delay line 210 receives the internal falling clock FCLK in synchronization with the falling edge of the external clock CLK, and the second delay line 220 receives the internal rising clock RCLK in synchronization with the rising edge of the external clock CLK. Meanwhile, the shift register 230 determines a delay amount of the first and the second delay lines 210 and 220.

The first duty controller 320 controls a duty rate of the output clock iFCLK of the first delay line 210 through an extended mode register set (EMRS) input EMRS<5,6,9> or a fuse option FS<0:3>. Likewise, the second duty controller 340 controls a duty rate of the output clock iRCLK of the second delay line 220 through the EMRS input EMRS<5,6,9> or the fuse option FS<0:3>.

The first DLL driver 420 drives an output FCLK_D of the first duty controller 320 so as to generate a first DLL clock FCLK_DLL, and the second DLL driver 440 drives an output RCLK_D of the second duty controller 340 so as to generate a second DLL clock RCLK_DLL.

The delay model 130 is configured such that it receives the output RCLK_D of the second duty controller 340 and its clock has the same delay condition with an actual clock path. The phase comparator 140 compares the output FBCLK of the delay model 130 with the internal rising clock RCLK to output a control signal CTRL. The shift controller 240 outputs shift control signals SR and SL for controlling a shift direction of the shift register 230 in response to the control signal CTRL outputted from the phase comparator 140.

Since the DLL of the present invention further includes the first and the second duty controllers 320 and 340 for controlling the duty rate of the clock though the EMRS input EMRS<5,6,9> or the fuse option FS<0:3>, it is possible to control the duty rate of the first and the second DLL clocks FCLK_DLL and RCLK_DLL in virtue of only the EMRS input without any physical adjustment.

Figure 3:
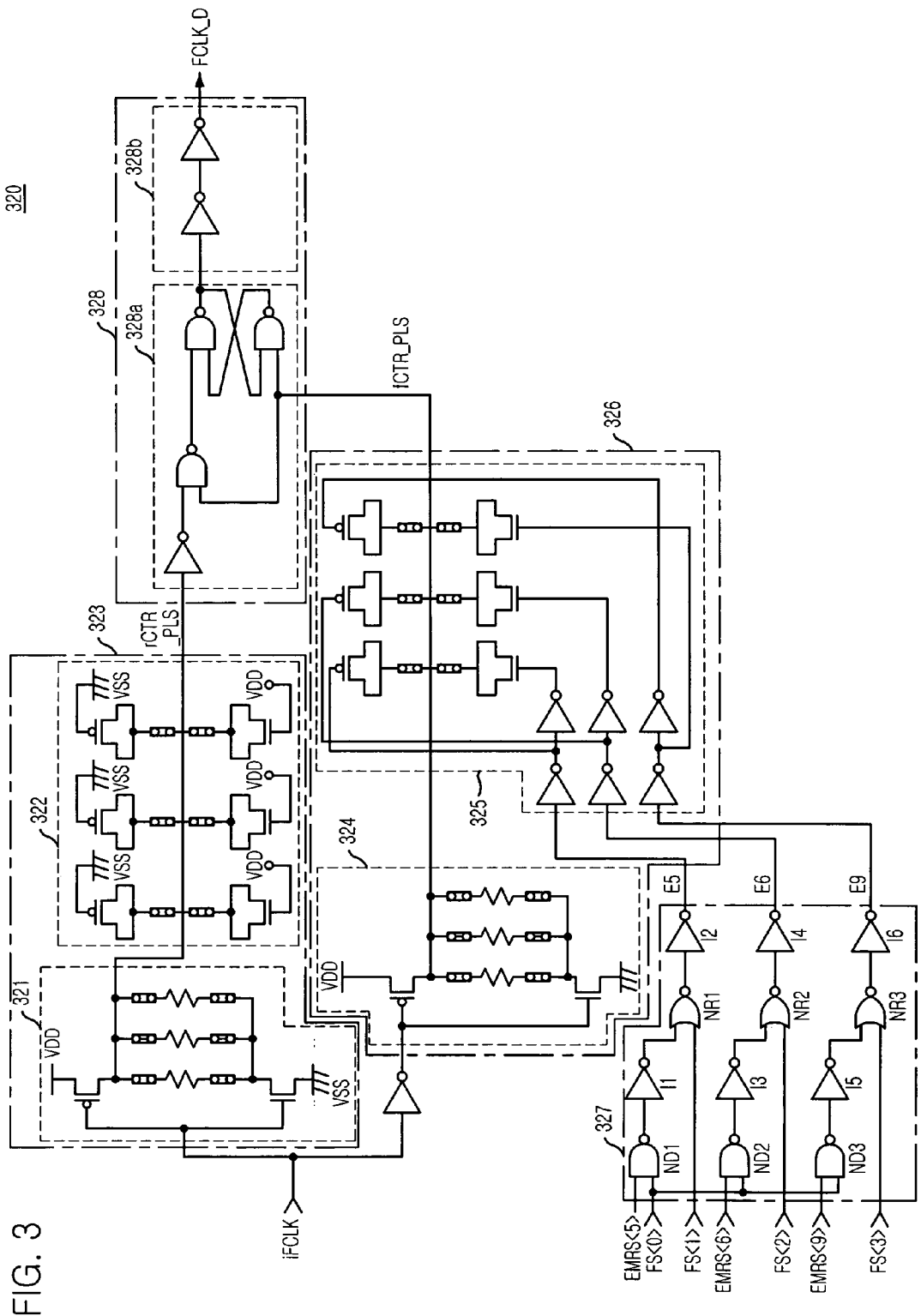
FIG. 3 is a circuit diagram illustrating the first duty controller of FIG. 2.

FIG. 3 is a circuit diagram illustrating the first duty controller 320 of FIG. 2.

Herein, a circuit design of the second duty controller 340 is identical to that of the first one 320 so that detail descriptions are focused on only the first duty controller 320.

Referring to FIG. 3, the first duty controller 320 is provided with a rising timing controller 323, a delay control signal generator 327, a falling timing controller 326 and a signal generator 328. Herein, the rising timing controller 323 outputs a rising control pulse signal rCTR_PLS for controlling a rising time of the output clock FCLK_D after delaying the output clock IFCLK of the first delay line 210. The delay control signal generator 327 receives the fuse option FS<0:3> or the EMRS input EMRS<5,6,9> to generate a first to a third delay control signals E5, E6 and E9. The falling timing controller 326 outputs a falling control pulse signal fCTR_PLS for controlling a falling time of the output clock FCLK_D after delaying the output clock iFCLK of the first delay line 210 according to the first to the third delay control signals E5, E6 and E9. The signal generator 328 generates the output clock FCLK_D in response to the falling edges of the rising control pulse signal rCTR_PLS and the falling control pulse signal fCTR_PLS.

The delay control signal generator 327 is configured with a first NAND gate ND1 for performing a logic NAND operation to an EMRS input EMRS<5> and a fuse driving signal FS<0>, a first inverter I1 for inverting an output signal of the first NAND gate ND1, a first NOR gate NR1 for performing a logic NOR operation to an output signal of the first inverter I1 and a fuse option FS<1>, a second inverter I2 for inverting an output signal of the first NOR gate NR1 to output a first delay control signal E5, a second NAND gate ND2 for performing a logic NAND operation to an EMRS input EMRS<6> and the fuse driving signal FS<0>, a third inverter I3 for inverting an output signal of the second NAND gate ND2, a second NOR gate NR2 for performing a logic NOR operation to an output signal of the third inverter I3 and a fuse option FS<2>, a fourth inverter I4 for inverting an output signal of the second NOR gate NR2 to output a second delay control signal E6, a third NAND gate ND3 for performing a logic NAND operation to an EMRS input EMRS<9> and the fuse driving signal FS<0>, a fifth inverter I5 for inverting an output signal of the third NAND gate ND3, a third NOR gate NR3 for performing a logic NOR operation to an output signal of the fifth inverter I5 and a fuse option FS<3>, and a sixth inverter I6 for inverting an output signal of the third NOR gate NR3 to output a third delay control signal E9.

The rising timing controller 323 is configured with a first input buffer 321 for receiving the output clock iFCLK of the first delay line 210, and a first delay unit 322 for delaying an output clock of the first input buffer 321.

The falling timing controller 326 is configured with a second input buffer 324 for receiving an inverted signal of the output clock iFCLK of the first delay line 210, and a second delay unit 325 for delaying an output clock of the second input buffer 324 according to the first to the third delay control signals E5, E6 and E9 so as to output a predetermined delay signal.

The signal generator 328 is configured with a latch unit 328a for outputting a predetermined signal in synchronization with the falling edges of the rising control pulse signal rCTR_PLS and the falling control pulse signal fCTR_PLS, and a buffer 328b for buffering an output signal of the latch unit 328a.

The first duty controller 320, as described above, synchronizes the rising edge of the output clock FCLK_D with the falling edge of the rising control pulse signal rCTR_PLS outputted from the rising timing controller 323, and synchronizes the falling edge of the output clock FCLK_D with the falling edge of the falling control pulse signal fCTR_PLS outputted from the falling timing controller 326.

However, the first delay unit 322 in the rising timing controller 323 has a fixed delay amount, whereas a delay amount of the second delay unit 325 in the falling timing controller 326 is controlled through the EMRS input EMRS<5,6,9> or the fuse option FS<0:3>.

Therefore, the duty rate of the output clock FCLK_D of the first duty controller 320 can be controlled through the EMRS input EMRS<5,6,9> or the fuse option FS<0:3>.

Figure 4:
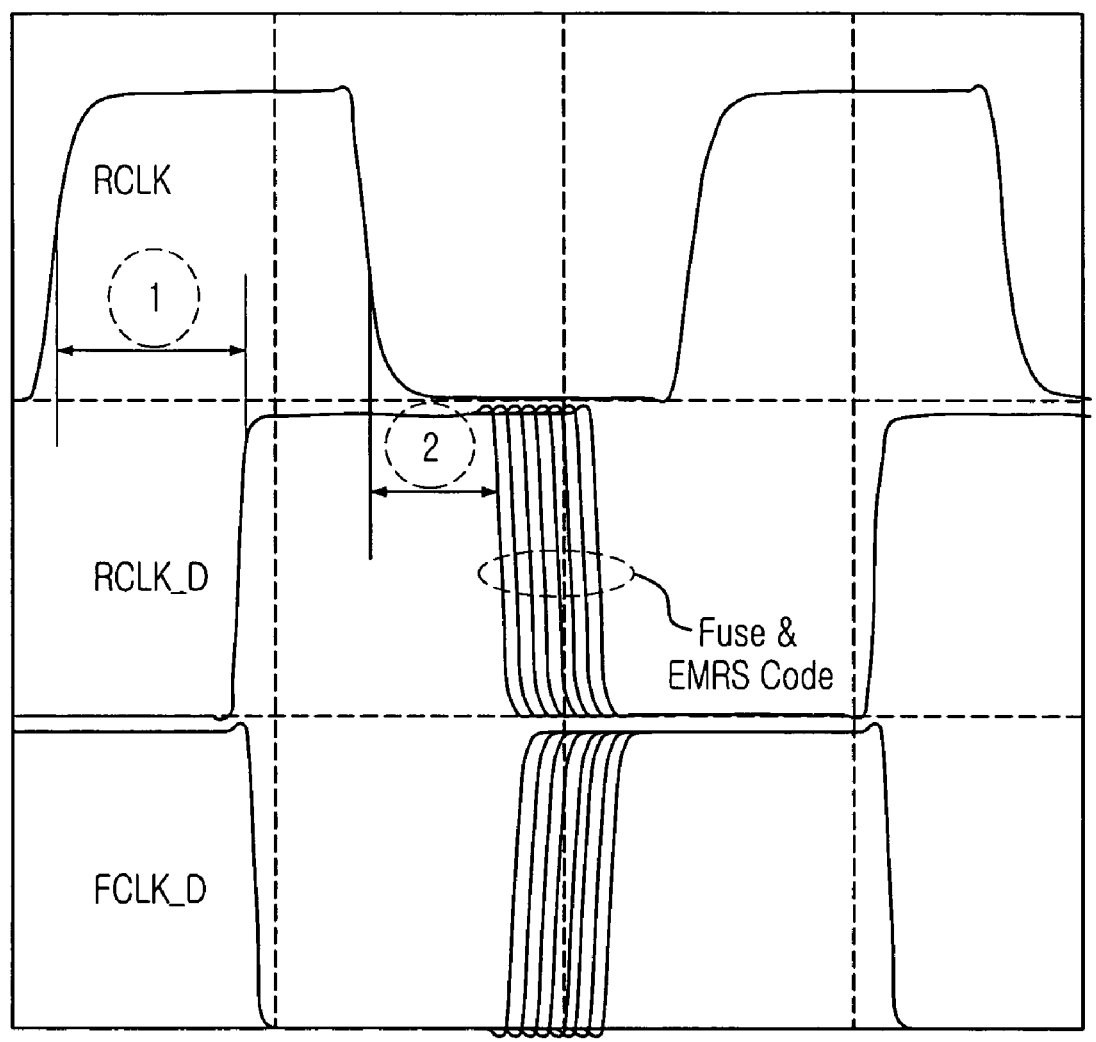
FIG. 4 is a simulation waveform diagram representing a duty rate variance of output clocks of the first and the second duty controllers in the DLL of FIG. 2 in accordance with an extended mode register set (EMRS) input or a fuse option.

FIG. 4 is a simulation waveform diagram representing a duty rate variance of the output clocks FCLK_D and RCLK_D of the first and the second duty controllers 320 and 340 in the DLL of FIG. 2 in accordance with the EMRS input EMRS<5,6,9> or a fuse option FS<0:3>.

In addition, a simulation result is summarized in a following table 1 so that the simulation result will be set forth more fully in detail with reference to the following table 1 and FIG. 4.

TABLE 1

| Type | | | Delta Amount |
|---|---|---|---|
| EMRS9 FUSE2 | EMRS6 FUSE1 | EMRS5 FUSE0 | at Duty Rate of 50% |
| 0 | 0 | 0 | 0 |
| 0 | 0 | 1 | −150 ps |
| 0 | 1 | 0 | −100 ps |
| 0 | 1 | 1 | −50 ps |

TABLE 1-continued

| Type | | | Delta Amount |
|---|---|---|---|
| EMRS9 FUSE2 | EMRS6 FUSE1 | EMRS5 FUSE0 | at Duty Rate of 50% |
| 1 | 0 | 0 | +200 ps |
| 1 | 0 | 1 | +150 ps |
| 1 | 1 | 0 | +100 ps |
| 1 | 1 | 1 | +50 ps |

As illustrated in the above table 1, it is possible to reduce or extend a logic high level interval of the output clocks FCLK_D and RCLK_D of the first and the second duty controllers 320 and 340 to a predetermined degree ranging from −150 ps to +200 ps with respect to a logic low level interval through the EMRS input EMRS<5,6,9> or a fuse option input FS<0:3>.

Therefore, since the DLL of the present invention employs the first and the second duty controllers therein, it is possible to control the duty rate of the first and the second DLL clocks through the EMRS input and fix the duty rate through the fuse option.

Figure 5:
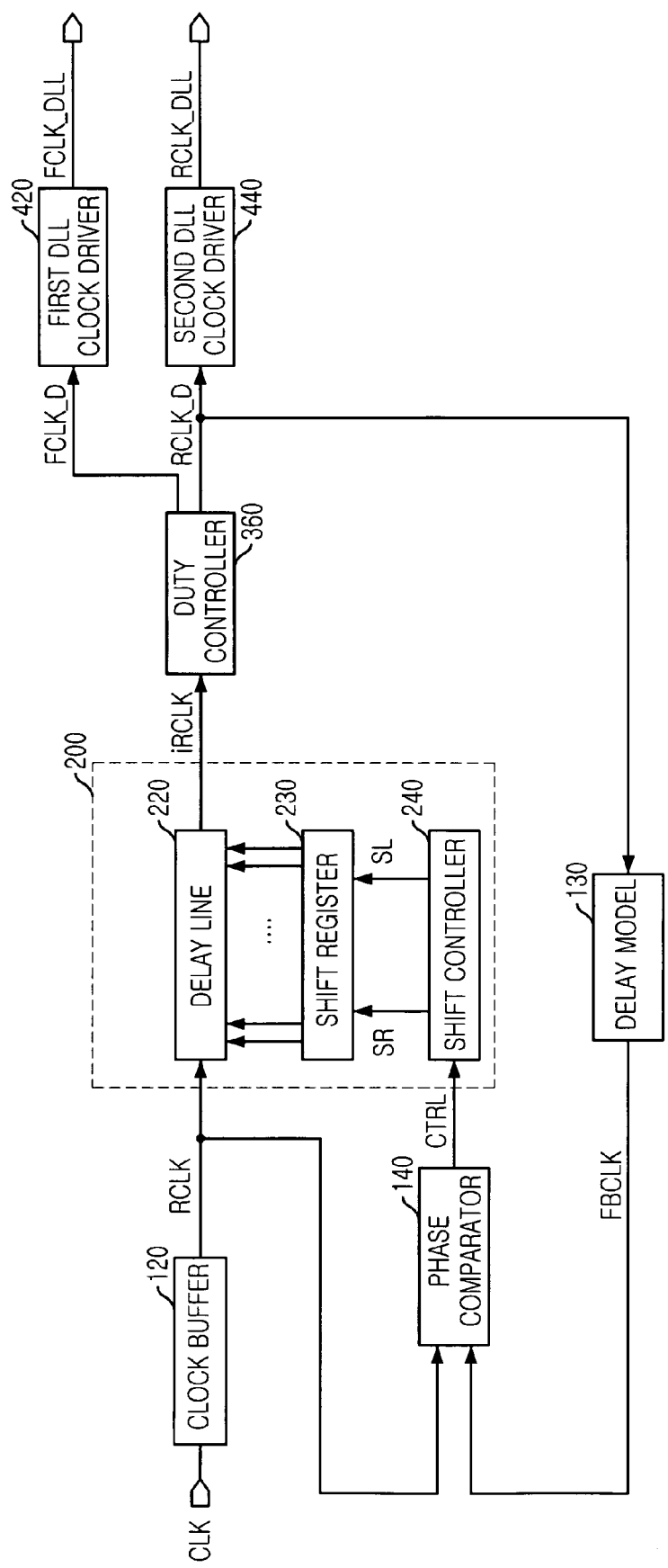
FIG. 5 is a block diagram setting forth a DLL in accordance with a second embodiment of the present invention.

FIG. 5 is a block diagram setting forth a DLL in accordance with a second embodiment of the present invention.

Referring to FIG. 5, it is understood that the DLL of the second embodiment does not employ a clock buffer, a delay line and a duty controller for an external clock bar signal CLKB because the external clock bar signal CLKB is not applied to the DLL, which is different from the DLL of FIG. 2. The reason is that the DLL of the second embodiment includes a clock buffer 120 of a CMOS inverter type.

Therefore, in accordance with the second embodiment of the present invention, a duty controller 360 receives an output clock iRCLK of a delay line 220 so as to generate a falling DLL clock FCLK_D and a rising DLL clock RCLK_D for controlling a duty rate.

Figure 6:
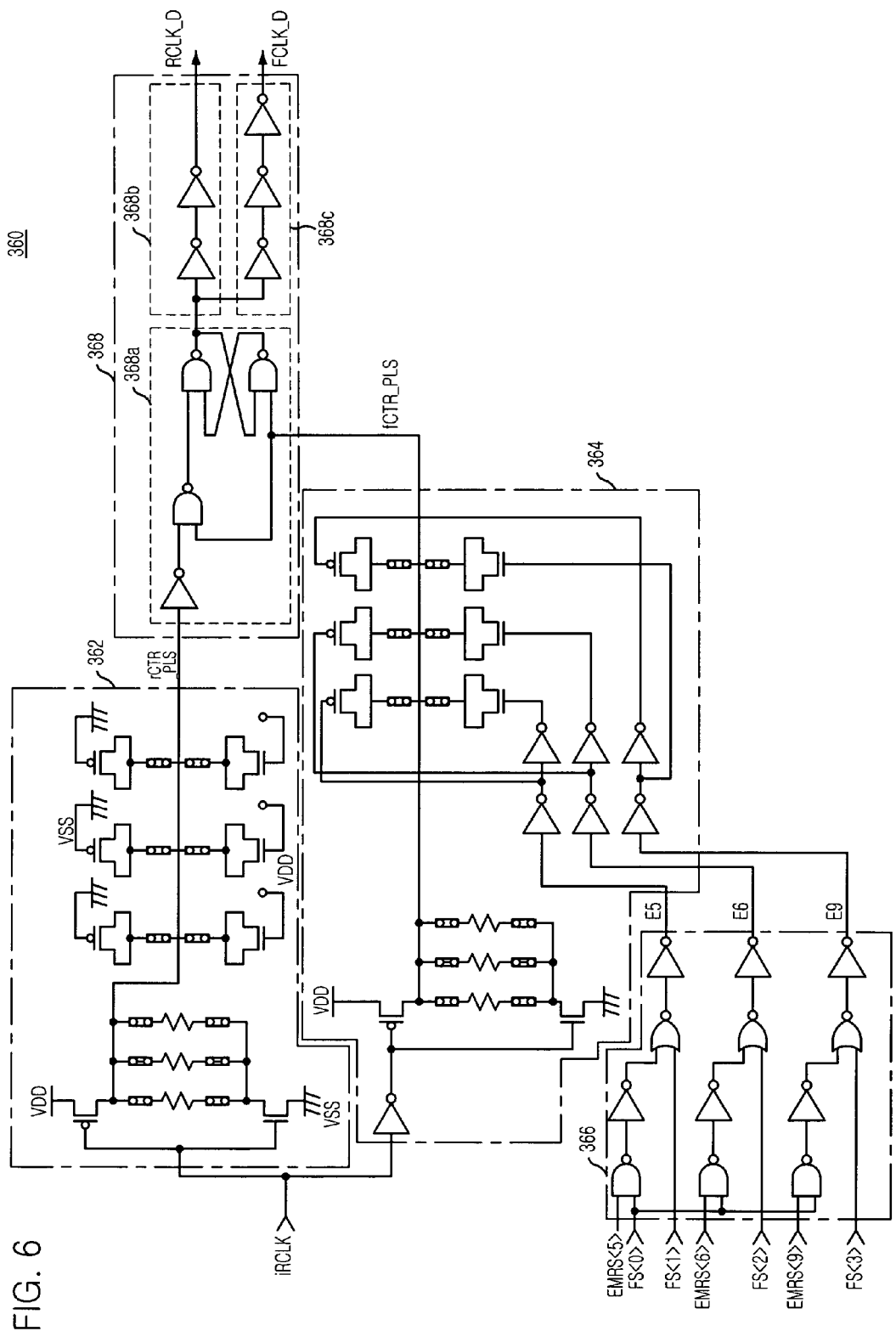
FIG. 6 is a circuit diagram illustrating the duty controller of FIG. 5.

FIG. 6 is a circuit diagram illustrating the duty controller 360 of FIG. 5.

Referring to FIG. 6, a signal generator 368 of the duty controller 360 is provided with a latch unit 368a, a buffer 368b for outputting the rising DLL clock RCLK_D after buffering an output signal of the latch unit 368a, and an inversion buffer 368c for buffering and inverting the output signal of the latch unit 368a so as to output the falling DLL clock FCLK_D.

Whereas, as illustrated in FIG. 3, the DLL of the first embodiment employs only one buffer 328b in the signal generator 328 of the first duty controller 320, which is significantly different from the DLL of the second embodiment.

Except that the signal generator 368 of the duty controller 360 in the second embodiment employs the inversion buffer 368c additionally to generate the falling DLL clock FCLK_D and the rising DLL clock RCLK_D, the constitution and its operation are identical to the duty controller in the first embodiment so that further detail descriptions will be omitted herein.

Therefore, it is understood that the DLL of the second embodiment receives an external clock CLK only and generates the falling DLL clock FCLK_D and the rising DLL clock RCLK_D through the buffer 368b and the inversion buffer 368c in the duty controller 360.

As described already, the DLL of the first and the second embodiments further include the duty controller in comparison with the prior art so that it is possible to control the duty rate of the first and the second DLL clocks through the EMRS input or the fuse option.

The present application contains subject matter related to Korean patent application No. 2005-17303, filed in the Korean Intellectual Property Office on Mar. 2, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A delay locked loop (DLL), comprising:
   a clock delay unit for receiving an external clock and an external clock bar signal to generate an internal falling clock and an internal rising clock having a predetermined delay amount;
   a duty control unit for controlling each duty rate of the internal falling clock and the internal rising clock based on an extended mode register set (EMRS) input or a fuse option; and
   a DLL clock driving unit for driving output clocks of the duty control unit to generate a DLL clock,
   wherein the duty control unit includes:
   a rising timing control for outputting a rising control pulse signal to control a point of a rising time of its own output clock by delaying the internal falling clock and the internal rising clock;
   a delay control signal generator for receiving the fuse option or the EMRS input to generate first to third delay control signals;
   a falling timing control unit for outputting a falling control pulse signal to control a point of a falling time of its own output clock by delaying the internal falling clock and the internal rising clock according to the first to third delay control signals; and
   a signal generator for generating its own output clock in response to the rising and the falling control pulse signals.

2. The DLL of claim 1, wherein one of the output clocks of the duty control unit is fed back to the clock delay unit.

3. The DLL of claim 2, wherein the clock delay unit includes:
   a first clock buffer for receiving the external clock bar signal to generate the internal falling clock in synchronization with a falling edge of the external clock;
   a second clock buffer for receiving the external clock to generate the internal rising clock in synchronization with a rising edge of the external clock;
   a first delay line for receiving the internal falling clock in synchronization with the falling edge of the external clock;
   a second delay line for receiving the internal rising clock in synchronization with the rising edge of the external clock;
   a shift register for determining the delay amount of the first and the second delay lines;
   a delay model for receiving one of the output clocks of the duty control unit, having the same delay condition with an actual clock path;
   a phase comparator for comparing an output phase of the delay mode with a phase of the internal rising clock; and
   a shift control unit for controlling a shift direction of the shift register in response to a control signal outputted from the phase comparator.

4. The DLL of claim 3, wherein the duty control unit includes:
   a first duty control unit for controlling a duty rate of an output clock of the first delay line through the EMRS input or the fuse option; and
   a second duty control unit for controlling a duty rate of an output clock of the second delay line through the EMRS input or the fuse option.

5. The DLL of claim 4, wherein the DLL clock driving unit includes:
   a first DLL clock driving unit for driving an output clock of the first duty control unit to generate a first DLL clock; and
   a second DLL clock driving unit for driving an output clock of the second duty control unit to generate a second DLL clock.

6. The DLL of claim 5, wherein the signal generator generates its own output clock in response to falling edges of the rising and the falling control pulse signals.

7. The DLL of claim 6, wherein the delay control signal generator includes:
   a first NAND gate for performing a logic NAND operation to a first EMRS input and a first fuse option;
   a first inverter for inverting an output signal of the first NAND gate;
   a first NOR gate for performing a logic NOR operation to an output signal of the first inverter and a second fuse option;
   a second inverter for inverting an output signal of the first NOR gate to output the first delay control signal;
   a second NAND gate for performing a logic NAND operation to a second EMRS input and the first fuse option;
   a third inverter for inverting an output signal of the second NAND gate;
   a second NOR gate for performing a logic NOR operation to an output signal of the third inverter and a third fuse option;
   a fourth inverter for inverting an output signal of the second NOR gate to output the second delay control signal;
   a third NAND gate for performing a logic NAND operation to a third EMRS input and the first fuse option;
   a fifth inverter for inverting an output signal of the third NAND gate;
   a third NOR gate for performing a logic NOR operation to an output signal of the fifth inverter and a fourth fuse option; and
   a sixth inverter for inverting an output signal of the third NOR gate to output the third delay control signal.

8. The DLL of claim 7, wherein the rising timing control unit includes:
   a first input buffer for receiving the output clock of the first delay line; and
   a first delay unit for delaying an output clock of the first input buffer.

9. The DLL of claim 8, wherein the falling timing control unit includes:
   a second input buffer for receiving an inverted output clock of the first delay line; and
   a second delay unit for delaying an output clock of the second input buffer according to the first to the third delay control signals so as to output a predetermined delay signal.

10. The DLL of claim 9, wherein the signal generator includes:
 a latch unit for outputting a predetermined signal in synchronization with falling edges of the rising control pulse signal and the falling control pulse signal; and
 a buffer for buffering an output signal of the latch unit.

11. A semiconductor memory device for receiving an external clock to generate DLL clocks by controlling a duty rate, comprising:
 a clock buffer for receiving an external clock to generate an internal rising clock in synchronization with a rising edge of the external clock;
 a delay line for receiving the internal rising clock in synchronization with the rising edge of the external clock;
 a shift register for determining a delay amount of the delay line;
 a duty control unit for controlling a duty rate of an output clock of the delay line based on the EMRS input or the fuse option to output a first and a second output clocks;
 a first DLL clock driving unit for driving the first output clock to generate a first DLL clock;
 a second DLL clock driving unit for driving the second output clock to generate a second DLL clock;
 a delay model configured such that it receives the first output and its clock has the same delay condition with an actual clock path;
 a phase comparator for comparing an output phase of the delay mode with a phase of the internal rising clock; and
 a shift control unit for controlling a shift direction of the shift register in response to a control signal outputted from the phase comparator,
 wherein the duty control unit includes:
 a rising timing control for outputting a rising control pulse signal in order to control a point of a rising time of its own output clock by delaying the output clock of the delay line;
 a delay control signal generator for receiving the fuse option or the EMRS input to generate first to third delay control signals;
 a falling timing control unit for outputting a falling control pulse signal in order to control a point of a falling time of its own output clock by delaying the output clock of the delay line according to the first to the third delay control signals; and
 a signal generator for generating its own output clock in response to the rising and the falling control pulse signals.

12. The device of claim 11, wherein the duty control unit includes:
 signal generator generates its own output clock in response to falling edges of the rising and the falling control pulse signals.

13. The device of claim 12, wherein the delay control signal generator includes:
 a first NAND gate for performing a logic NAND operation to a first EMRS input and a first fuse option;
 a first inverter for inverting an output signal of the first NAND gate;
 a first NOR gate for performing a logic NOR operation to an output signal of the first inverter and a second fuse option;
 a second inverter for inverting an output signal of the first NOR gate to output the first delay control signal;
 a second NAND gate for performing a logic NAND operation to a second EMRS input and the first fuse option;
 a third inverter for inverting an output signal of the second NAND gate;
 a second NOR gate for performing a logic NOR operation to an output signal of the third inverter and a third fuse option;
 a fourth inverter for inverting an output signal of the second NOR gate to output the second delay control signal;
 a third NAND gate for performing a logic NAND operation to a third EMRS input and the first fuse option;
 a fifth inverter for inverting an output signal of the third NAND gate;
 a third NOR gate for performing a logic NOR operation to an output signal of the fifth inverter and a fourth fuse option; and
 a sixth inverter for inverting an output signal of the third NOR gate to output the third delay control signal.

14. The device of claim 13, wherein the rising timing control unit includes:
 a first input buffer for receiving the output clock of the first delay line; and
 a first delay unit for delaying an output clock of the first input buffer.

15. The device of claim 14, wherein the falling timing control unit includes:
 a second input buffer for receiving an inverted output clock of the first delay line; and
 a second delay unit for delaying an output clock of the second input buffer according to the first to the third delay control signals so as to output a predetermined delay signal.

16. The device of claim 15, wherein the signal generator includes:
 a latch unit for outputting a predetermined signal in synchronization with falling edges of the rising control pulse signal and the falling control pulse signal;
 a buffer for buffering an output signal of the latch unit so as to output the first output clock; and
 an inversion buffer for buffering the output signal of the latch unit so as to output clock.

* * * * *